United States Patent
Lee et al.

(10) Patent No.: US 11,362,109 B2
(45) Date of Patent: Jun. 14, 2022

(54) INTEGRATED POWER AMPLIFIER

(71) Applicant: International Business Machines Corporation, Armonk, NY (US)

(72) Inventors: Ko-Tao Lee, Yorktown Heights, NY (US); Xin Zhang, Chappaqua, NY (US); Todd Edward Takken, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 18 days.

(21) Appl. No.: 16/600,604

(22) Filed: Oct. 14, 2019

(65) Prior Publication Data

US 2021/0111192 A1 Apr. 15, 2021

(51) Int. Cl.
| | |
|---|---|
| *H01L 27/12* | (2006.01) |
| *H01L 21/84* | (2006.01) |
| *H01L 21/762* | (2006.01) |
| *H01L 29/78* | (2006.01) |
| *H01L 29/20* | (2006.01) |
| *H01L 21/02* | (2006.01) |
| *H01L 29/66* | (2006.01) |

(52) U.S. Cl.
CPC .... *H01L 27/1207* (2013.01); *H01L 21/76264* (2013.01); *H01L 21/84* (2013.01); *H01L 21/0254* (2013.01); *H01L 29/2003* (2013.01); *H01L 29/66462* (2013.01)

(58) Field of Classification Search
CPC ............. H01L 21/0254; H01L 27/1207; H01L 27/76264; H01L 29/2003; H01L 21/02458; H01L 21/823481; H01L 21/823878; H01L 21/8258; H01L 27/1203; H01L 29/0649; H01L 29/7786
See application file for complete search history.

(56) References Cited

U.S. PATENT DOCUMENTS

| | | | |
|---|---|---|---|
| 8,373,508 B2 | 2/2013 | Acar et al. | |
| 8,704,601 B2 | 4/2014 | Nam et al. | |
| 8,736,383 B2 | 5/2014 | Acar et al. | |
| 8,754,712 B2 | 6/2014 | Seebacher | |
| 9,118,283 B2 | 8/2015 | Buisman et al. | |
| 9,407,214 B2* | 8/2016 | Pribble | H03F 1/0288 |
| 9,935,175 B1* | 4/2018 | Lee | H01L 21/0243 |

(Continued)

FOREIGN PATENT DOCUMENTS

| | | |
|---|---|---|
| CA | 2592736 C | 7/2006 |
| EP | 2267886 A1 | 12/2010 |
| WO | 2006073701 A3 | 7/2006 |

OTHER PUBLICATIONS

Nishikawa, K., "GaN for Automotive Applications", IEEE BCTM 9.2, © 2013 IEEE, 8 pages.

(Continued)

*Primary Examiner* — David C Spalla
(74) *Attorney, Agent, or Firm* — Stephen R. Yoder

(57) ABSTRACT

The semiconductor structure includes a semiconductor-on-insulator (SOI) substrate. A group III nitride transistor is formed in a trench in the SOI substrate. The activation of the group III nitride transistor is controlled by a silicon-based transistor. The silicon-based transistor that includes a portion of a silicon layer of the SOI substrate. A group III nitride transistor device is adjacent to the silicon-based transistor.

14 Claims, 11 Drawing Sheets

(56) References Cited

U.S. PATENT DOCUMENTS

| | | |
|---|---|---|
| 2013/0187713 A1 | 7/2013 | Acar |
| 2015/0014778 A1* | 1/2015 | Cheng .............. H01L 21/823878 257/369 |
| 2015/0318276 A1* | 11/2015 | Bayram ................. H01L 29/16 257/195 |
| 2017/0005111 A1* | 1/2017 | Verma ................. H01L 27/1207 |
| 2017/0104012 A1* | 4/2017 | Cheng ................. H01L 27/1207 |
| 2019/0096916 A1* | 3/2019 | Czornomaz ......... H01L 21/0254 |
| 2019/0244955 A1* | 8/2019 | Zhang ................. H01L 27/1207 |
| 2019/0273028 A1* | 9/2019 | Jain .................... H01L 29/1079 |
| 2019/0333965 A1* | 10/2019 | Campanella-Pineda .................... H01L 23/291 |
| 2020/0135766 A1* | 4/2020 | Dutta ................. H01L 27/1207 |
| 2020/0295045 A1* | 9/2020 | Lee .................... H01L 29/7786 |

OTHER PUBLICATIONS

Watanabe, N., "GaN-on-Si Technology for High-power Transistors", NTT Technical Review, vol. 12, No. 4, Apr. 2014, 6 pages.

Xu et al., "A High-Efficiency Class-E GaN HEMT Power Amplifier at 1.9 GHz", IEEE Microwave and Wireless Components Letters, vol. 16, No. 1, Jan. 2006, © IEEE 2006, 3 pages.

* cited by examiner

INTEGRATED POWER AMPLIFIER

BACKGROUND

The present application generally relates to semiconductor device fabrication, and more particularly to the integration of Group III nitride structures with a silicon substrate.

Group III nitride compounds, such as gallium nitride (GaN) and its related alloys, are a unique group of semiconductor materials that can be used in a wide variety of applications such as optoelectronics, photovoltaics, and lighting. The relatively large bandgap and high electron saturation velocity of the Group III nitride compounds also make them excellent candidates for applications in high temperature and high-speed power electronics.

A Monolithic Microwave Integrated Circuit, or MMIC (sometimes pronounced "mimic"), is a type of integrated circuit (IC) device that operates at microwave frequencies (300 MHz to 300 GHz). These devices typically perform functions such as microwave mixing, power amplification, low-noise amplification, and high-frequency switching. Inputs and outputs on MIMIC devices are frequently matched to a characteristic impedance of 50 ohms. This may make them easier to use, as use of cascading of MMICs does not then require an external matching network. Additionally, some microwave test equipment is designed to operate in a 50-ohm environment.

SUMMARY

According to one embodiment of the present disclosure, a semiconductor structure is provided. The semiconductor structure includes a semiconductor-on-insulator (SOI) substrate, a silicon-based transistor that includes a portion of a silicon layer of the SOI substrate, and a group III nitride transistor device that is embedded in the SOI substrate and is adjacent to the silicon-based transistor.

According to one embodiment of the present disclosure, a method of forming a semiconductor structure is provided. The method includes: forming a semiconductor-on-insulator (SOI) substrate, forming a silicon-based transistor that includes a portion of a silicon layer of the SOI substrate, and forming a group III nitride transistor device that is embedded in the SOI substrate and is adjacent to the silicon-based transistor.

BRIEF DESCRIPTION OF THE DRAWINGS

The following detailed description, given by way of example and not intend to limit the disclosure solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
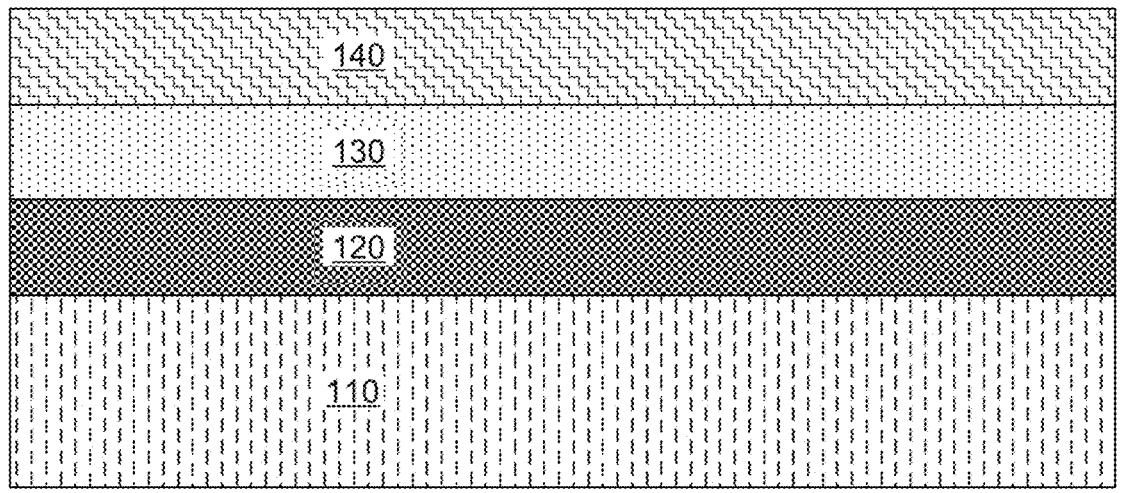
FIG. 1 is a cross-sectional view of an exemplary semiconductor structure after providing a semiconductor-on-insulator (SOI) substrate that includes, from bottom to top, a (111) silicon layer, a buried insulator layer, a (100) silicon layer, and a pad dielectric stack on the SOI substrate according to an embodiment of the present application, in accordance with an embodiment of the present invention.

Monolithic Microwave Integrated Circuits (MMICs) are dimensionally small (often from around 1 mm$^2$ to 10 mm$^2$) and can be mass-produced, which has aided the proliferation of high-frequency devices such as cellular phones. Originally, MMICs used MEtal-Semiconductor Field-Effect Transistors (MESFETs) as active devices. However, more recently High Electron Mobility Transistors (HEMTs), Pseudomorphic HEMTs, and Heterojunction Bipolar Transistors have become more common.

HEMTs are a type of field effect transistor (FET), that is used to offer a combination of low noise figure and very high levels of performance at microwave frequencies. A High-electron-mobility transistor (HEMT), also known as heterostructure FET (HFET) or modulation-doped FET (MODFET), is a field-effect transistor incorporating a junction between two materials with different band gaps (i.e. a heterojunction) as the channel instead of a doped region (as is generally the case for MOSFET).

Transistors in MMICs can be fabricated using Gallium Nitride (GaN), which is a III-V compound semiconductor. GaN transistors can provide various advantages when compared to silicon (Si) transistors. These advantages can include (i) device (transistor) speed and (ii) a semi-insulating substrate, both of which can aid with the design and operation of high-frequency circuit functions. However, the speed of Si-based technologies has gradually increased as transistor feature sizes have reduced, which has provided an opportunity for MMICs to also be fabricated as part of such Si-based integrated circuits.

Another commonly used material combination for HMETs is GaAs with AlGaAs, though there is wide variation, dependent on the application of the device. Because GaN transistors can operate at much higher temperatures and work at much higher voltages than GaAs transistors, GaN transistors can provide relatively better characteristics for power amplifiers at microwave frequencies when compared to the characteristics of GaAs transistors.

One advantage of Si technology over GaN is its lower fabrication cost compared with GaN. Silicon wafer diameters are larger (typically 8" to 15" compared with 4" to 8" for GaN wafers) and the wafer costs are lower, contributing to a less expensive integrated circuit (IC). As such, embodiments recognize that there are (i) certain performance based advantages that can be realized by the incorporation of GaN based transistors and (ii) that there is a significant increase in cost that typically comes with the incorporation of GaN based transistors. Embodiments provide an incorporation of GaN based transistors while minimizing the amount of GaN based materials that are used, which may mitigate the increase in cost that is associated with the incorporation of such GaN based transistors.

Further, other III-V technologies, such as indium phosphide (InP), have been shown to offer superior performance to GaAs in terms of gain, higher cutoff frequency, and low noise. However, like GaN HMETs, InP transistors also tend to be more expensive due to smaller wafer sizes and increased material fragility. Some embodiments may incorporate Indium-based structures, e.g, an Indium-Aluminum-Gallium Nitride (InAlGaN)/GaN HEMT. Embodiments further recognize that silicon germanium (SiGe) is a Si-based compound semiconductor technology that can offer higher-speed transistors than conventional Si devices but with similar cost advantages to Si devices. However, embodiments also recognize that GaN transistors typically provide better characteristics for power amplifiers at microwave frequencies when compared to such SiGe transistors.

One embodiment leverages a material combination of GaN with $Al_xGa_{(1-x)}N$, though there may be variation, dependent on the application of the device. In some embodiments, gallium nitride HEMTs are leveraged to provide relatively higher power performance. In some embodiments, such HEMTs are used in integrated circuits as digital on-off switches. In some embodiments, such HEMTs are used as amplifiers for large amounts of current using a small voltage, from a silicon-based transistor, as a control signal. Embodiments recognize that HEMT transistors are able to operate at higher frequencies when comparted to silicon-based transistors, up to millimeter wave frequencies. Embodiments provide incorporation of GaN based HMETs in high-frequency products such as, but are not limited to, power amplifiers, cell phones, satellite/television receivers, voltage converters, and microwave-based equipment.

Embodiments provide electronics applications that incorporate both silicon and Group III nitride circuits due to their unique performance characteristics. The silicon circuits may be CMOS circuits used for digital signals, and the Group III nitride circuits may be used for microwave, millimeter wave, or optical signals. This integration can be realized by forming both silicon CMOS devices and Group III nitride devices on a common silicon-on-insulator substrate, in which the CMOS devices are formed on an upper silicon layer having a (100) crystallographic orientation, while the Group III nitride devices are formed on a bottom silicon layer having a (111) crystallographic orientation. However, since epitaxial growth of Group III nitride compounds on a (111) silicon layer is typically performed at a relatively high temperature (e.g., 700° C.-1200° C.), the high deposition temperatures can cause diffusion of Group III elements into the silicon substrate, which may lead to the deterioration of CMOS device performance. Although diffusion barriers can be employed to prevent the Group III elements from diffusing into the silicon substrate, such diffusion barriers typically do not possess good growth selectivity towards Group III nitride compounds. As such, embodiments provide and leverage methods for integrating Group III nitride materials/ structures with a silicon substrate.

Electric inductance is a property of all conductors. A change in the current flowing through the conductor creates (induces) a voltage in that conductor, as well as all nearby conductors. The induced voltage opposes the change in the current that induced the voltage. Inductance is a consequence of two laws of physics. Firstly, a constant current flowing through a conductor creates a constant magnetic field. Secondly, a variable magnetic field induces a voltage in all nearby conductors, including the conductor which was used to create the magnetic field in the first place. When these two laws are combined, the resulting effect is inductance. Just like resistors are used to introduce a desired resistance in a circuit, and like capacitors are used to introduce a desired capacitance, inductors are electrical elements used to introduce a desired amount of inductance into the circuit.

Whenever current flows, there is an induced magnetic field (Ampere's Law) and when a magnetic field varies (as happens when current varies) you have an induced voltage (Faraday's Law). As such, by combining these two principles, (i) when current varies (ii) then a corresponding voltage is induced (and vice versa), this ratio between voltage and the time derivative of current is called inductance.

For most connecting wires, this ratio tends to be quite small, small enough that such an unwanted inductance is relatively small. However, sometimes that small (but non-zero) inductance does make a difference and is labelled parasitic inductance. Parasitic inductance is typically an unwanted inductance effect that is unavoidably present in all real electronic devices. As opposed to deliberate inductance, which is introduced into the circuit by the use of an inductor, parasitic inductance is almost always an undesired effect. There are few applications in which parasitic inductance is actually a desired effect, such as helical resonators which can be used as filters. Just like all other real elements used in electronics, such as resistors and capacitors, connecting wires exhibit various levels of parasitic inductance.

Embodiments recognize that a Si-based transistor can be integrated with a GaN-based transistor through the use of bonding wires that connect them, i.e., a silicon-substrate circuit is bonded to a GaN-based substrate circuit. However, embodiments further recognize that such a bonding may result in undesirable levels of parasitic inductance due to the wire bonding between a GaN HEMT and the Si unit. As such, embodiments integrate a GaN-based transistor into a silicon-based substrate, thereby significantly shortening the wires connecting the GaN-based transistor to one or more silicon-based structures that are included in the silicon-based substrate.

Embodiments provide a shortened distance between silicon unit/IC and GaN HEMTs. The short physical distance between the silicon transistor and the GaN HEMT significantly reduces the parasitic resistance and inductance between them. High speed signals are able to travel from the silicon transistor to the GaN HEMT with a higher frequency and lower distortion, without creating overshoot voltage when there is large parasitic inductance. Therefore, the integrated power amplifier (PA) can operate at a higher switching frequency. Embodiments recognize that the operating speed of GaN-based HEMTs is about ~10 times than that of Si-based components. Further, the small parasitic resistance and inductance between the silicon transistor and the GaN FET also enables a faster turn-on/off speed and a lower switching loss is achieved. In addition, embodiments recognize that GaN-based HEMTs have much smaller resistance-on ($R_{ON}$) than Si based components, and it can reduce the conduction loss to 50% or less.

Exemplary embodiments now will be described more fully herein with reference to the accompanying drawings, in which exemplary embodiments are shown. In the following detailed description, numerous specific details are set forth in order to provide a thorough understanding of various embodiments of the invention. However, it is to be understood that embodiments of the invention may be practiced without these specific details. As such, this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

As described below in conjunction with FIGS. 1-12, embodiments may include methods of forming a semiconductor device with an integrated GaN based transistor. The method described below in conjunction with FIGS. 1-12 may be incorporated into typical semiconductor fabrication processes, such as fabrication processes.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is focused on the distinctive features or elements of various embodiments of the present invention.

The present invention will now be described in detail with reference to the Figures.

As used herein, terms such as "depositing", "forming", and the like may refer to the disposition of layers, or portions of materials, in accordance with a given embodiment. Such processes may or may not be different than those used in the standard practice of the art of semiconductor device fabrication. Such processes include, but are not limited to, atomic layer deposition (ALD), molecular layer deposition (MLD), chemical vapor deposition (CVD), low-pressure chemical vapor deposition (LPCVD), plasma enhanced chemical vapor deposition (PECVD), limited reaction processing CVD (LRPCVD), ultrahigh vacuum chemical vapor deposition (UHVCVD), metalorganic chemical vapor deposition (MOCVD), physical vapor deposition, sputtering, plating, evaporation, ion beam deposition, electron beam deposition, laser assisted deposition, chemical solution deposition, or any combination of those methods.

As used herein, terms, such as "forming," and the like, may refer to processes that alter the structure and/or composition of one or more layers of material or portions of materials in accordance with a given embodiment. For example, such formation processes may include, but are not limited to, exposure to a specific frequency or range of frequencies of electromagnetic radiation, ion implantation techniques, and/or chemical/mechanical polishing (CMP). As used herein, terms, such as "forming," and the like, may refer to processes that alter the structure of one or more layers of material, or portions of material(s), by removal of a quantity of material, in accordance with a given embodiment. For example, such formation processes may include, but are not limited to, wet and/or dry etching processes, plasma etching processes, or any of the known etching processes in which material is removed.

Those skilled in the art understand that many different techniques may be used to add, remove, and/or alter various materials, and portions thereof, and that embodiments of the present invention may leverage combinations of such processes to produce the structures disclosed herein without deviating from the scope of the present invention.

FIG. 1 is a cross-sectional view of an exemplary semiconductor structure after providing a semiconductor-on-insulator (SOI) substrate. The exemplary semiconductor structure includes, from bottom to top, a silicon layer having a (111) crystallographic orientation and is herein referred to as silicon layer 110, a buried insulator layer 120, and a silicon layer having a (100) crystallographic orientation (herein referred to as silicon layer 130. The buried insulator layer 120 isolates silicon layer 130 from the silicon layer 110.

Silicon layer 110 and silicon layer 130 can both be single crystalline. Moreover, silicon layer 130 can be doped, undoped, or contain certain regions that are doped and other regions that are non-doped. The dopant may be an n-type dopant selected from an Element from Group VA of the Periodic Table of Elements (i.e., P, As and/or Sb) or a p-type dopant selected from an Element from Group IIIA of the Periodic Table of Elements (i.e., B, Al, Ga and/or In). Silicon layer 130 may contain one region that is doped with a p-type dopant and another region that is doped with an n-type dopant. The thickness of the silicon layer 110 can be from 600 nm to 2 µm, although lesser and greater thicknesses can also employed. The thickness of the silicon layer 110 can be from 40 nm to 100 nm, although lesser and greater thicknesses can also be employed.

Buried insulator layer 120 may include a dielectric material such as silicon dioxide, silicon nitride, silicon oxynitride, boron nitride or a combination thereof. The thickness of the buried insulator layer 120 can be from 50 nm to 200 nm, although lesser or greater thicknesses can also be employed.

The SOI substrate (110, 120, 130) shown in FIG. 1 can be formed utilizing any conventional bonding process. For example, and in one embodiment, silicon layer 130 can be bonded to a structure comprising silicon layer 110 and buried insulator layer 120.

Pad dielectric stack 140 is shown as including at least one dielectric layer that has been formed on a top surface of silicon layer 130. Pad dielectric stack 140 can serve as an etch mask during the subsequent formation of trenches within the SOI substrate (110, 120, 130). Pad dielectric stack 140 may comprise a single pad dielectric layer, or pad dielectric stack 140 may comprise a multilayered structure. For example, pad dielectric stack 140 may comprise an oxide, a nitride, or a doped silicate glass material, or two or more of the aforementioned materials may be employed. The pad dielectric stack may be formed using a deposition process such as, for example, chemical vapor deposition (CVD), plasma-enhanced chemical vapor deposition (PECVD) or physical vapor deposition (PVD), and/or thermal growth process.

In one embodiment, pad dielectric stack 140 includes multiple layers of material. In one such embodiment, pad dielectric stack 140 includes a first pad dielectric layer, e.g., a pad nitride layer, and a second pad dielectric layer, e.g., a pad oxide layer. The second pad dielectric layer can optional in some embodiments and can be omitted in those embodiments of the present application. Thus, pad dielectric stack 140 contains at least a single pad dielectric layer as is shown. In one embodiment, pad dielectric stack 140 includes multiple layers of material and the first pad dielectric layer is composed of a pad nitride layer, the pad nitride layer may be silicon nitride having a thickness ranging from 1 nm to 100 nm. In one such embodiment, the second pad dielectric layer is composed of a pad oxide layer, the pad oxide layer may be silicon dioxide having a thickness ranging from 10 nm to 100 nm.

Figure 2:
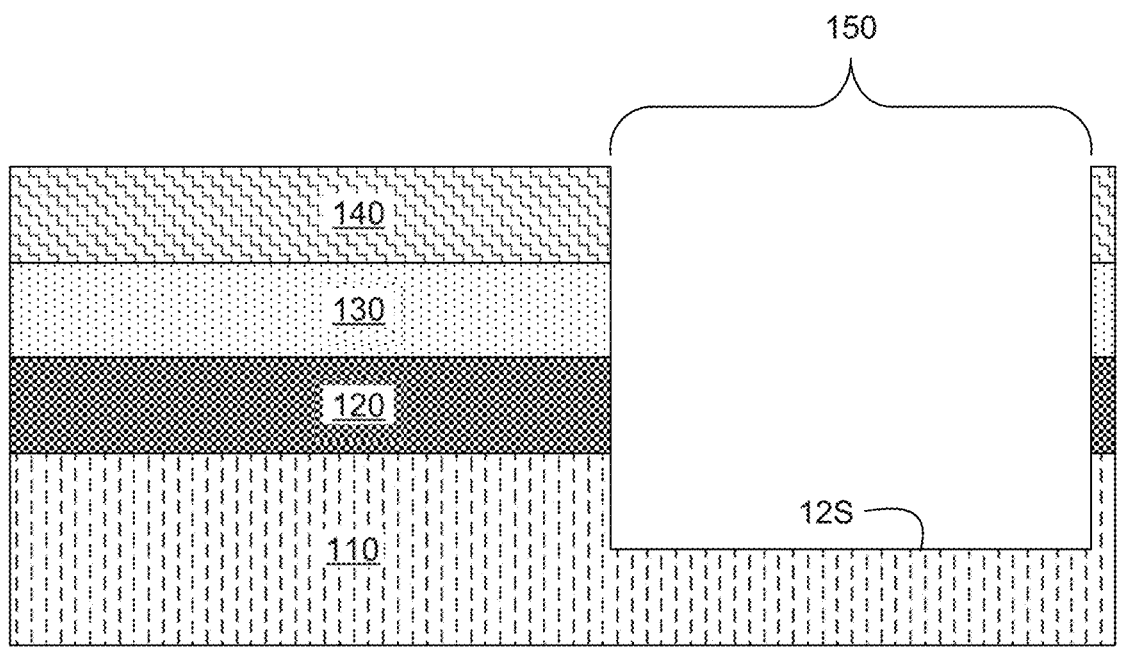
FIG. 2 is a cross-sectional view of the exemplary semiconductor structure of FIG. 1 after forming a trench exposing a sub-surface of the (111) silicon layer, in accordance with an embodiment of the present invention.

FIG. 2 is a cross-sectional view of an exemplary semiconductor structure of FIG. 1 after forming a trench, 150, that exposes a sub-surface of the silicon layer 110, in accordance with an embodiment of the present invention. The trench 150 extends through the silicon layer 130, the buried insulator layer 120 and partially into the silicon layer 110, exposing a sub-surface 12S of the silicon layer 110 which is located beneath the top surface of the silicon layer 110. By "sub-surface" it is meant a surface of a material that is located between a topmost surface and a bottommost surface of the same material. The depth of the trench 150 can be from 300 nm to 3 µm, although lesser and greater depths can also be employed.

Trench 150 can be formed by lithography and etching. Specifically, a blanket layer of a photoresist material (not shown) is first applied on the topmost surface of the pad dielectric stack 140 (e.g., the top surface of the first pad dielectric layer, or the top surface of the second pad dielectric layer if present) and lithographically patterned to form an opening therein. The pattern of the opening in the photoresist layer is then transferred into the underlying pad dielectric stack 140 and SOI substrate (110, 120, 130) by an anisotropic etch to form trench 150. In some embodiments, multiple anisotropic etches can be used. The anisotropic etch can be a dry etch such as, for example, reactive ion etch (RIE), or a wet etch. After at least transferring the trench pattern to pad dielectric stack 140, remaining partitions of the photoresist layer can be removed from the structure utilizing a conventional resist stripping process such as, for example, ashing.

Figure 3:
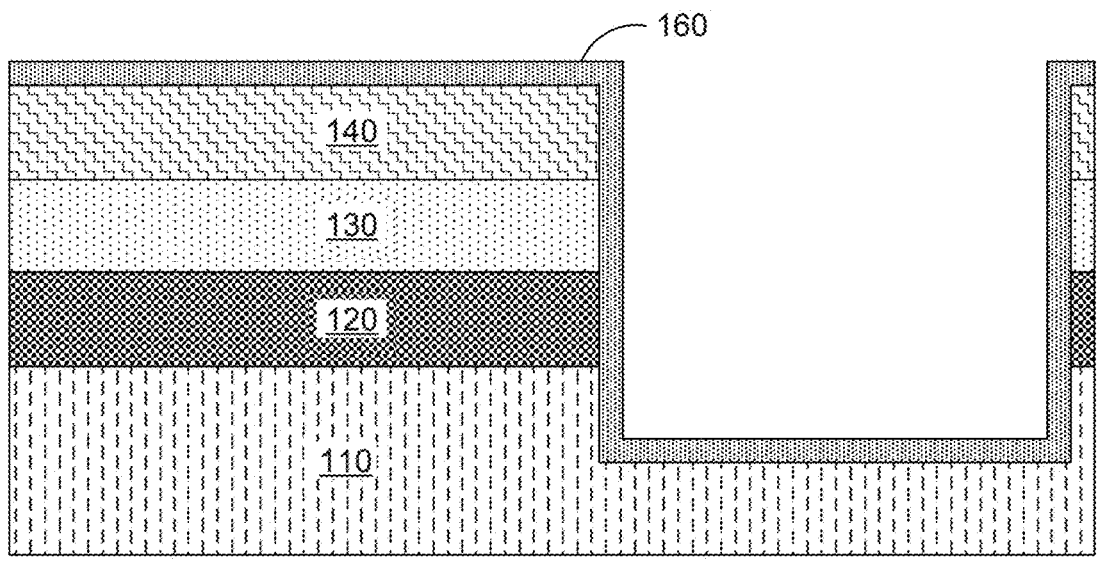
FIG. 3 is a cross-sectional view of the exemplary semiconductor structure of FIG. 2 after forming a spacer material layer along bottom and sidewall surfaces of the trench and over the topmost surface of the pad dielectric stack, in accordance with an embodiment of the present invention.

FIG. 3 is a cross-sectional view of the exemplary semiconductor structure of FIG. 2 after forming a layer of spacer material layer (160) along bottom and sidewall surfaces of the trench and over the topmost surface of the pad dielectric stack in accordance with an embodiment of the present invention. Spacer material layer 160 is a conformal first spacer material layer that is formed along bottom and sidewall surfaces of the trench 150 and over the topmost surface of the pad dielectric stack 140. In general, spacer material layer 160 may include a dielectric material that can effectively prevent Group III element from diffusing into silicon layers 110, and 130. In one embodiment, spacer material layer 160 includes a dielectric nitride such as, for example, silicon nitride. Spacer material layer 160 can be formed by a conformal deposition process such as, for example, CVD, PECVD or atomic layer deposition (ALD). The thickness of the first spacer material layer 52L can be from 10 nm to 1 µm, although lesser and greater thicknesses can also be employed.

Figure 4:
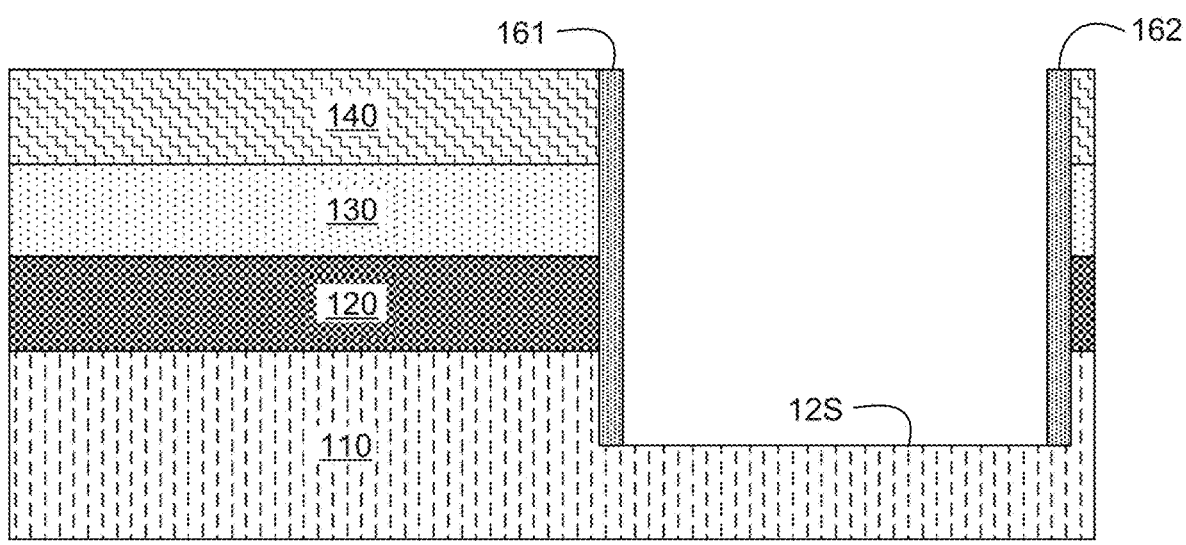
FIG. 4 is a cross-sectional view of the exemplary semiconductor structure of FIG. 3 after forming sidewall spacers on sidewalls of the trench, in accordance with an embodiment of the present invention.

FIG. 4 is a cross-sectional view of the exemplary semiconductor structure of FIG. 3 after forming sidewall spacers (161 and 162) on sidewalls of trench 150 in accordance with an embodiment of the present invention. As shown in FIG. 4, horizontal portions of spacer material layer 160 that are located over the topmost surface of the pad dielectric stack 140 and the bottom surface of the trench 150 are removed by an anisotropic etch. The anisotropic etch can be a dry etch such as, for example, RIE, or a wet etch that selectively removes portions of spacer material layer 160. In some embodiments, the etch is also selective to the dielectric material that provides the second pad dielectric layer, if present, and/or the dielectric material that provides the first pad dielectric layer. The removal of portions of spacer material layer 160 from the bottom surface of the trench 150 re-exposes the sub-surface 12S of silicon layer 110. The remaining portion of spacer material layer 160 is shown as being present on sidewalls of the trench 150 constitute sidewall spacers 161 and 162. Sidewall spacers 161 and 162 serve as a diffusion barrier preventing the diffusion of Group III element(s) into silicon layer 130 substrate during the high temperature Group III nitride growth process subsequently performed.

In one embodiment, a second type of sidewall spacer is formed on the sidewall spacers 161 and 162. For example, second sidewall spacers 165 and 166 of FIG. 6. Second sidewall spacers 165 and 166 may include a dielectric material that provides enhanced growth selectivity to Group III nitride materials when compared to the dielectric material that is included in sidewall spacers 161 and 162. In one embodiment, second sidewall spacers 165 and 166 include a dielectric oxide such as, for example, silicon dioxide, aluminum oxide or hafnium oxide. Second sidewall spacers 165 and 166 can be formed by conformally depositing a second spacer material layer (not shown) on the bottom surface of the trench 150, sidewall spacers 161 and 162, and the topmost surface of the pad dielectric stack 140. The second spacer material layer may be formed, for example, by CVD, PECVD or ALD. The thickness of the second spacer material layer can be from 10 nm to 1 µm, although lesser and greater thicknesses can also be employed. Subsequently, horizontal portions of the second spacer material layer can be removed by an anisotropic etch. The anisotropic etch can be a dry etch such as, for example, RIE or a wet etch that removes the dielectric material that provides the second spacer material layer selective to the dielectric materials that provide the pad dielectric stack 140 and sidewall spacers 161 and 162. The remaining portion of the second spacer material layer present on sidewall spacers 161 and 162 constitutes second sidewall spacers 165 and 166.

In one embodiment of the present application, by employing a two-spacer structure, in which (I) sidewall spacers 161 and 162 are adjoined to the silicon sidewalls and are employed as a diffusion barrier to prevent the diffusion of group III elements into adjacent layers of silicon (i.e., (111) silicon layer 110 and (100) silicon layer 130) during the epitaxial deposition of group III nitride materials, and (II) the second sidewall spacers 165 and 166 are employed to provide enhanced growth selectivity for group III nitride material deposition, the diffusion and growth selectivity problems encountered in the conventional approach for the integration of group III nitride materials with silicon substrates are overcome. As a result, the performance of integrated silicon-based and Group III nitride-based devices can be greatly improved.

Figure 5:
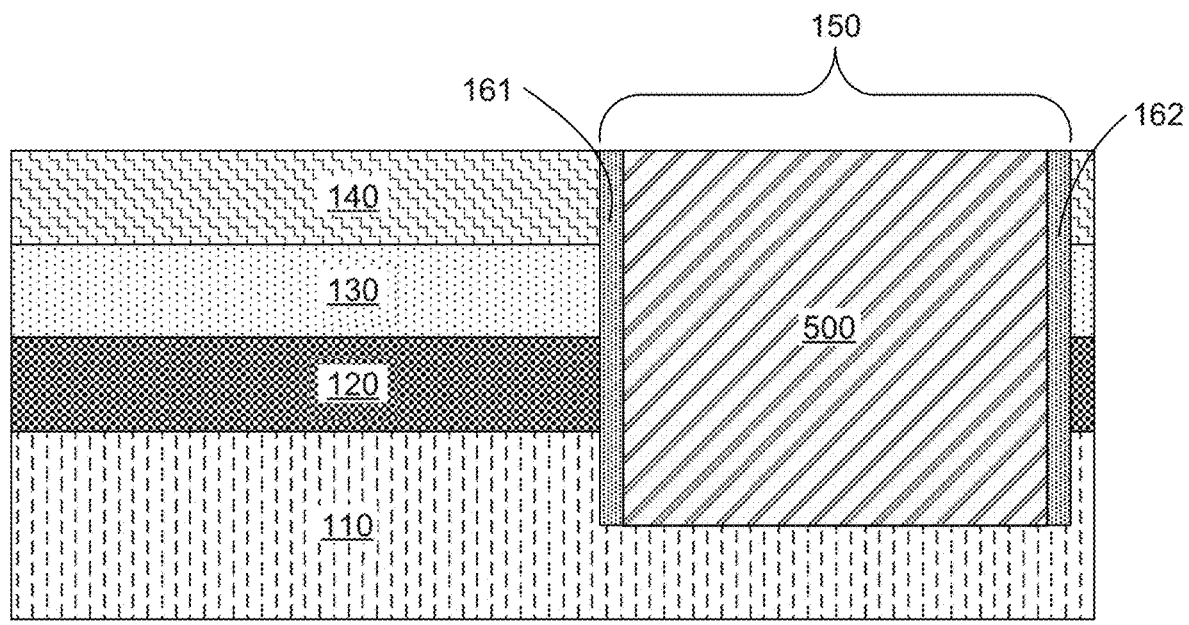
FIG. 5 is a cross-sectional view of the exemplary semiconductor structure of FIG. 4 after forming a Group III nitride layer within the trench, in accordance with an embodiment of the present invention.

FIG. 5 is a cross-sectional view of the exemplary semiconductor structure of FIG. 4 after forming a group III nitride layer, herein called "group III nitride" 500, within the trench 150, in accordance with one embodiment of the present invention. While only one layer is shown, it is to be understood that group III nitride 500 may include multiple layers of material in accordance with a given embodiment. For example, FIG. 6 includes group III nitride buffer layer 600 and group III nitride channel layer 620. In one embodiment, group III nitride 500 and group III nitride buffer layer 600 are epitaxially grown from the sub-surface 12S of the silicon layer 110 that is physically exposed at the bottom of the trench 150. The term "group III nitride" as used throughout the present applicant denotes a compound that is composed of nitrogen and at least one element from group III, i.e., aluminum (Al), gallium (Ga) and indium (In), of the Periodic Table of Elements. Illustrative examples of some common group III nitride compounds are GaN, AlN, InN, GaInN, AlGaN, and GaAlInN. In one embodiment, group III nitride 500 and group III nitride buffer layer 600 are composed of GaN. In another embodiment, group III nitride 500 and group III nitride buffer layer 600 are composed of GaN and AlGaN.

Group III nitride 500 and group III nitride buffer layer 600 may be formed by a selective epitaxial growth process. The selective epitaxial growth process grows the group III nitride material that provides selective formation of group III nitride 500 and group III nitride buffer layer 600 only from the semiconductor surface such as exposed sub-surface 12S of silicon layer 110, but not from, for example, a dielectric surface, such as sidewall surfaces of sidewall spacers 161 and 162, or sidewall surfaces of second sidewall spacers 165 and 166, in accordance with a given embodiment. In one embodiment, group III nitride 500 and group III nitride buffer layer 600 may be formed, for example, by metal-organic chemical vapor deposition (MOCVD). The MOCVD process may include introducing a group III-containing precursor and a nitride precursor into the reactor chamber of an MOCVD apparatus. In some embodiments, the group III-containing precursor may be an organo-Group III containing compound, i.e., an organoaluminum compound, an organoindium compound, and/or an organogallium compound. In other embodiments, a group III halide (typically a chloride) can be employed as the group III-containing precursor. When an organo-group III containing compound is employed, the group III-containing precursor can be, for example, a trialkyl-group III compound, wherein the alkyl contains from 1 to 6 carbon atoms. Examples of group III compounds that can be employed in the present application, include, but are not limited to, trimethylaluminum, triethylaluminum, tributylaluminum, trimethylgallium, triethylgallium, tributylgallium, trimethylindium, triethylindium and tributylindium. Examples of nitride containing precursors that can be used include, for example, ammonium nitride.

An inert carrier gas may be present with one of the precursors used in forming group III nitride 500 and group III nitride buffer layer 600, or an inert carrier gas can be present with both the precursors (i.e., group III-containing precursor and a nitride precursor) used in forming group III nitride 500 and group III nitride buffer layer 600. The deposition of group III nitride 500 and group III nitride buffer layer 600 is typically performed at a temperature ranging from 700° C. to 1200° C. In one embodiment, the thickness of group III nitride buffer layer 600 that is formed can be from 100 nm to 2 µm, although lesser and greater thicknesses can also be employed.

In some embodiments of the present application, the group III nitride material of group III nitride 500 can be deposited until it overfills trench 150 (not shown). In such an embodiment, the overburdened group III nitride material can be removed by first subjecting the overburdened group III nitride material to a planarization process such as, for example, chemical mechanical polishing (CMP) and/or grinding, and thereafter a recess etch can be used to remove a top-most portion of the Group III nitride material within the trench 150 so as to provide the structure of group III nitride 500 as depicted in FIG. 5. Note that the remaining portion of trench 150 is filled with the group III nitride material of group III nitride 500 such that the entirety of trench 150 is filled by group III nitride 500 and sidewall spacers 161 and 162.

Figure 6:
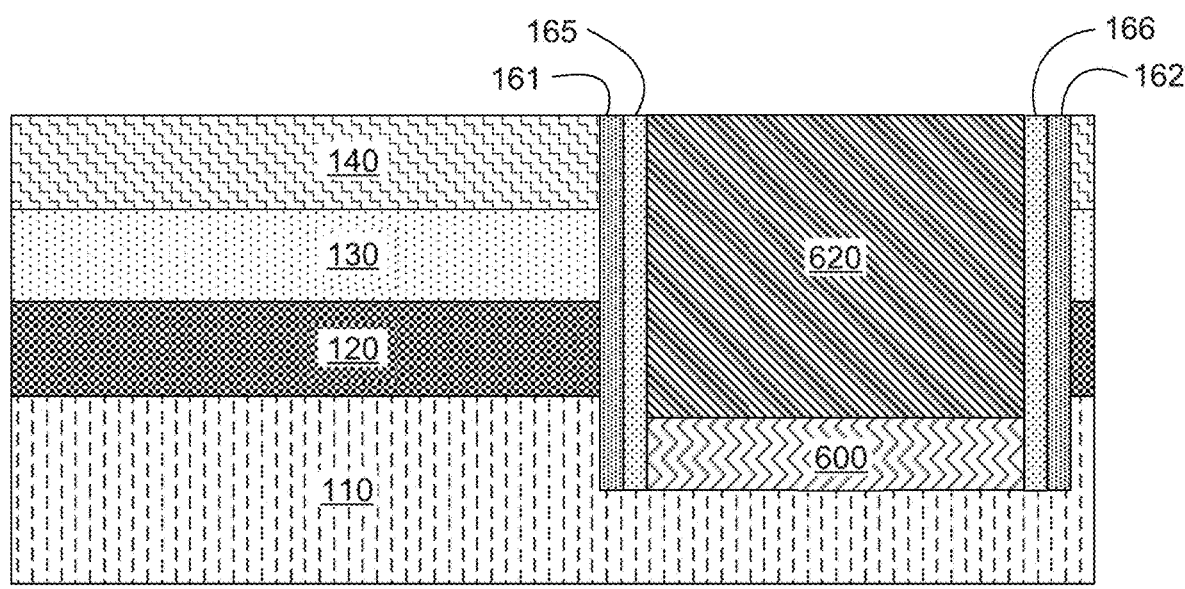
FIG. 6 is a cross-sectional view of the exemplary semiconductor structure of FIG. 5 after forming a Group III nitride layer within the trench, in accordance with an embodiment of the present invention.

FIG. 6 is a cross-sectional view of an alternative embodiment the exemplary semiconductor structure of FIG. 5 after forming a Group III nitride layer within the trench and includes a Group III nitride channel layer on the Group III nitride buffer layer within the trench and two types of sidewall spacers in accordance with an embodiment of the present invention. In one embodiment, a timed MOCVD process can be used in which the deposition only partially fills trench 150 with a portion of a first group III nitride material thereby forming group III nitride buffer layer 600. A resulting top surface of the first group III nitride material is thus located below the top surface of the silicon layer 130. In one such embodiment, a portion of a second group III material, denoted group III nitride channel layer 620, is formed on the first group III nitride material. In some embodiments, the second group III nitride material may include a group III nitride material having a bandgap different from the first group III nitride material that is included in group III nitride buffer layer 600. In one embodiment of the present application, the second group III nitride material has a greater bandgap than the first group III nitride material included in group III nitride buffer layer 600. In another embodiment of the present application, the second group III nitride material has a lower bandgap than the first group III nitride material included in group III nitride buffer layer 600. In one example, the second group III nitride material is comprised of AlGaN, while the first group III nitride buffer layer is comprised of GaN. A second group III nitride material that is comprised of AlGaN can be formed by MOCVD as described above in forming group III nitride buffer layer 600 that is comprised of GaN. The top surface of the resulting group III nitride channel layer 620 can be formed above, coplanar with, or below the top surface of the silicon layer 130. The formation of such a second group III nitride channel layer is optional and can be omitted in some embodiments of the present application.

Figure 7:
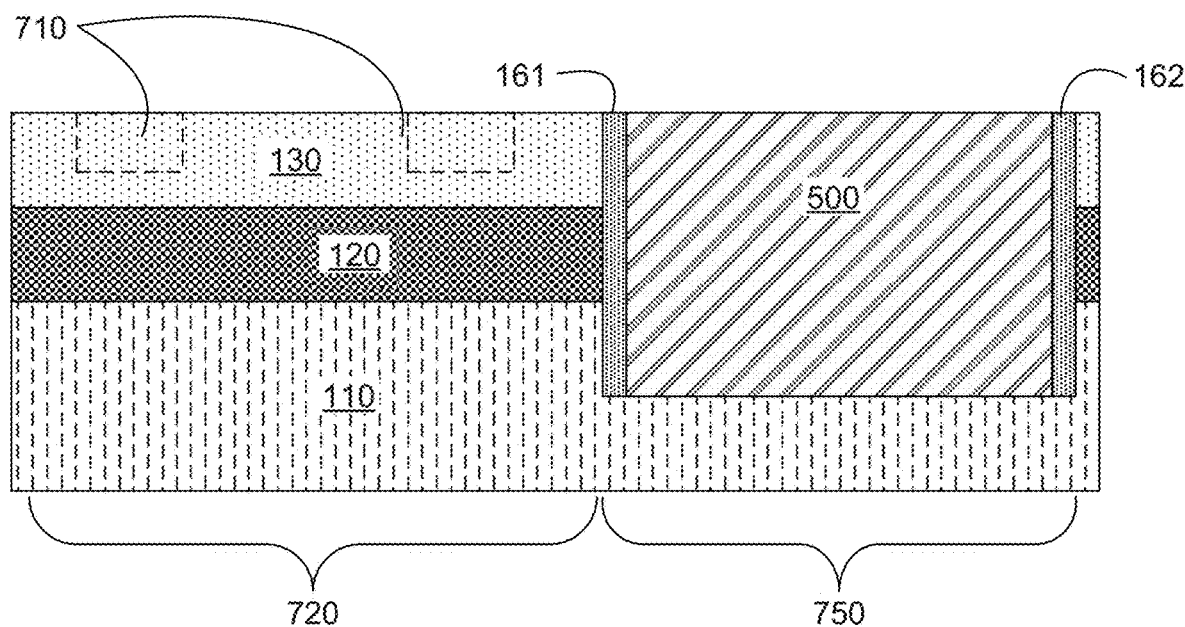
FIG. 7 is a cross-sectional view of the exemplary semiconductor structure of FIG. 5 after CMP process removes the pad dielectric stack and areas of (100) silicon layer are doped, in accordance with an embodiment of the present invention.

FIG. 7 is a cross-sectional view of the exemplary semiconductor structure of FIG. 5 after (i) a CMP process removes pad dielectric stack 140 and (ii) areas of doped silicon, denoted doped regions 710 and indicated by dashed boxes, of silicon layer 130 are doped in accordance with an embodiment of the present invention. In one embodiment, these doped areas may be doped to form n-type or p-type doped areas as is understood by those having ordinary skill in the art. For example, the pad dielectric stack 140 and portions of sidewall spacers 161 and 162 that are located above the top surface of the silicon layer 130 are removed by a planarization process such as, for example, chemical mechanical planarization (CMP). The planarized top surface of each of sidewall spacers 161 and 162 is coplanar with the top surface of silicon layer 130. The removal of pad dielectric stack 140 re-exposed the top surface of the silicon layer 130.

In some such embodiments, the planarization process also removes a top-most portion of group III nitride 500 or group III nitride channel layer 620 if group III nitride 500 or group III nitride channel layer 620 overfills trench 150. After planarization, the top surface of group III nitride 500 or group III nitride channel layer 620 is coplanar with the top surface of the silicon layer 130. Subsequently, conventional CMOS processing can be employed to form p-type and n-type transistors (not shown) in a transistor device region 720 (e.g., a physically exposed region of silicon layer 130 that includes the doped regions 710), and to form group III nitride device in a group III nitride device region 750.

Figure 8:
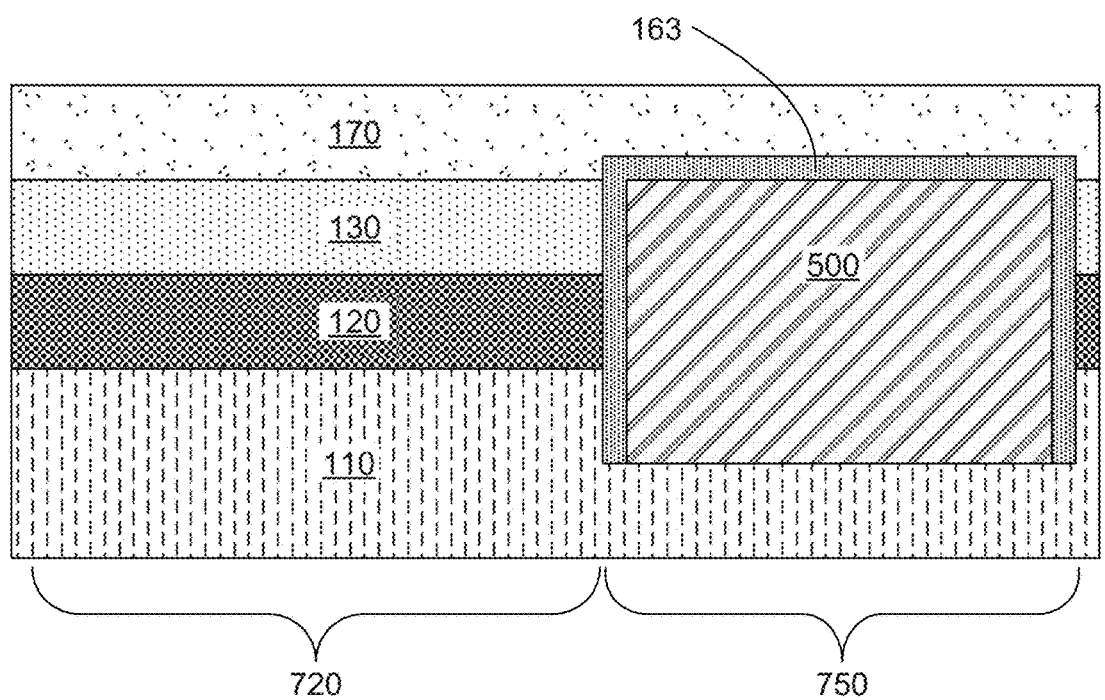
FIG. 8 is a cross-sectional view of the exemplary semiconductor structure of FIG. 7 after a horizontal portion of spacer material is formed that connects the sidewall spacers, in accordance with an embodiment of the present invention.

FIG. 8 is a cross-sectional view of the exemplary semiconductor structure of FIG. 7 after a horizontal portion of spacer material is formed that connects sidewall spacers 161 and 162, thereby forming spacer barrier 163. In some embodiments, the horizontal portion of spacer material is remaining portion of a conformal spacer material layer that is formed along the top-most surface of the exemplary semiconductor structure of FIG. 7. In general, this the horizontal portion of spacer material may include a dielectric material that can effectively prevent group III element(s) from diffusing into silicon layers 110, and 130. In one embodiment, the horizontal portion of spacer material includes a dielectric nitride such as, for example, silicon nitride. The horizontal portion of spacer material can be formed by a conformal deposition process such as, for example, CVD, PECVD or atomic layer deposition (ALD). The thickness of the horizontal portion of spacer material can be from 10 nm to 1 µm, although lesser and greater thicknesses can also be employed. In one embodiment, after a layer of spacer material is formed over the exemplary semiconductor structure of FIG. 7, a mask is formed to protect a portion of spacer material that is covering group III nitride 500. As such, a subsequent etch is used to remove the un-protected portions of the layer of spacer material, thereby forming spacer barrier 163. FIG. 8 further illustrates the formation a layer of dielectric material 170 that covers spacer barrier 163 and silicon layer 130.

Figure 9:
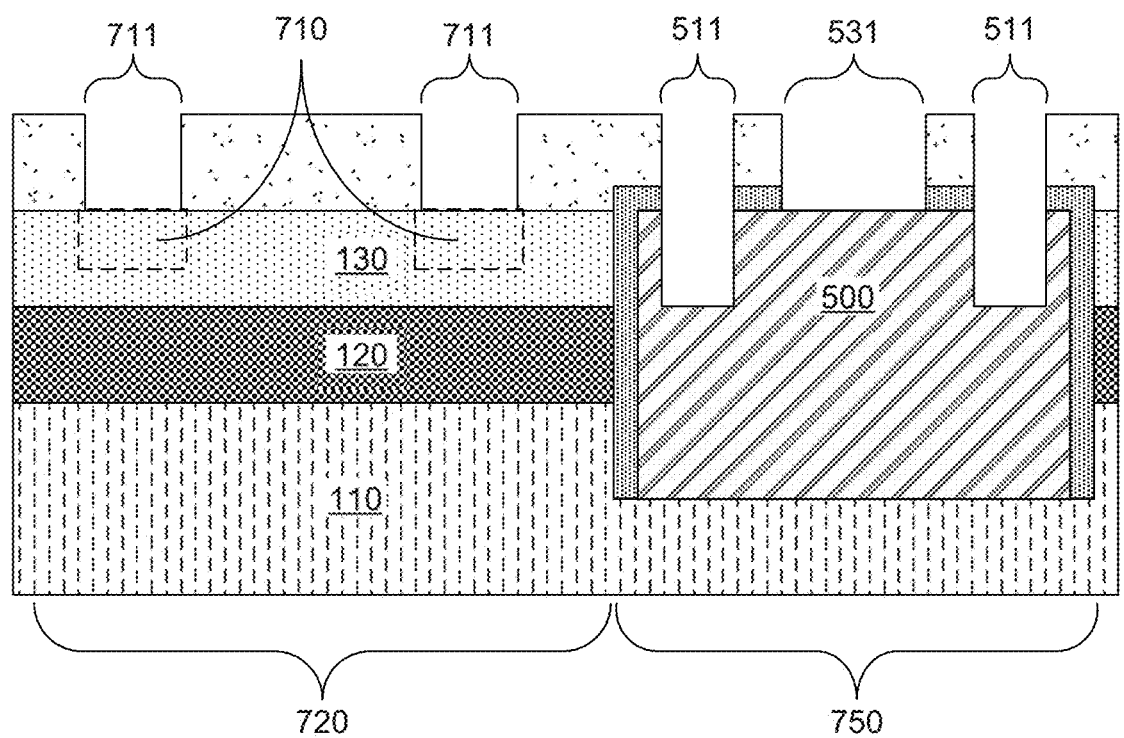
FIG. 9 is a cross-sectional view of the exemplary semiconductor structure of FIG. 8 after formation of a plurality of trenches in a layer of dielectric material and the layer of barrier material, in accordance with an embodiment of the present invention.

FIG. 9 is a cross-sectional view of the exemplary semiconductor structure of FIG. 8 after the formation of a plurality of trenches in the layer of dielectric material 170, the layer of barrier material, and group III nitride 500, in accordance with an embodiment of the present invention. As shown, there are two openings, 711, which are formed over and expose the top-most surface of doped regions 710. As shown, there are two openings, both denoted 511, which are formed over and penetrate into group III nitride 500. Finally, there is an opening 531, which is formed over and exposes the top-most surface of group III nitride 500.

Figure 10:
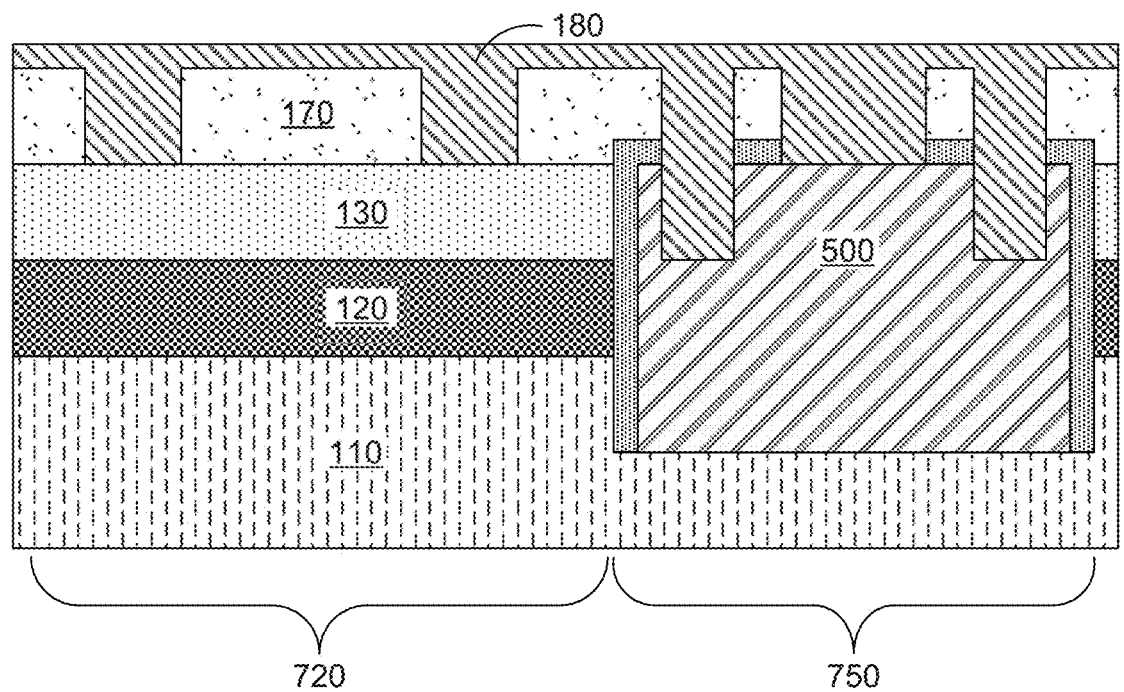
FIG. 10 is a cross-sectional view of the exemplary semiconductor structure of FIG. 9 after the plurality of trenches are filled with a conductive material, in accordance with an embodiment of the present invention.

FIG. 10 is a cross-sectional view of the exemplary semiconductor structure of FIG. 9 after the plurality of trenches (711, 511, and 531) in the layer of dielectric material 170 are filled with conductive material 180 in accordance with an embodiment of the present invention.

Figure 11:
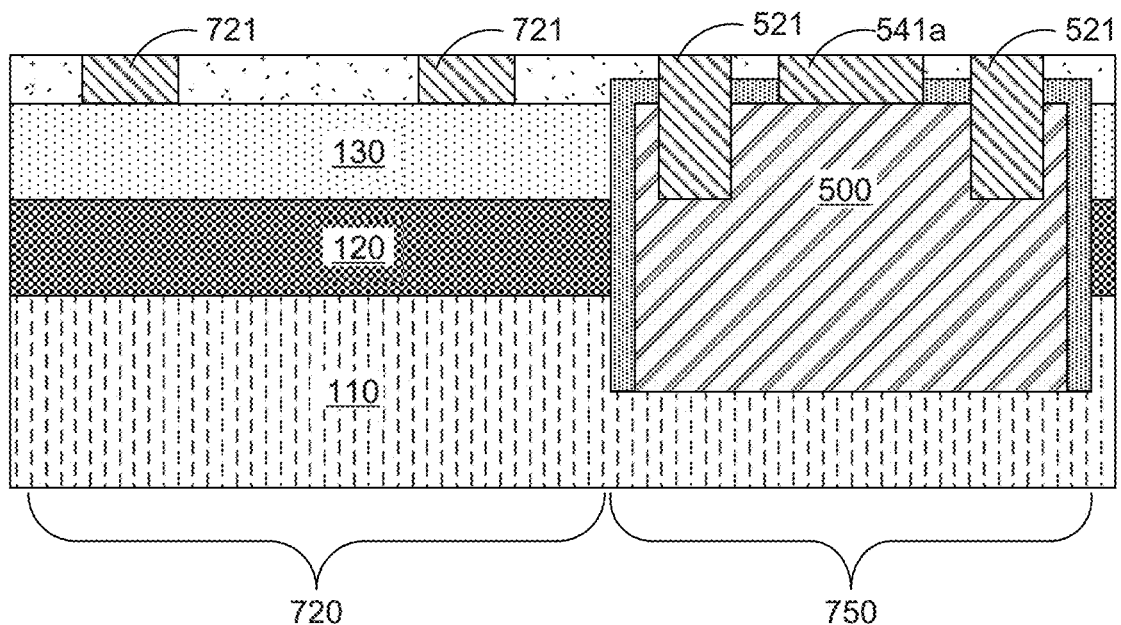
FIG. 11 is a cross-sectional view of the exemplary semiconductor structure of FIG. 10 after a CMP process removes select portions of the conductive material, in accordance with an embodiment of the present invention.

FIG. 11 is a cross-sectional view of the exemplary semiconductor structure of FIG. 10 after a CMP process removes select portions of conductive material 180 and dielectric material 170 in accordance with an embodiment of the present invention. As shown, the exemplary semiconductor structure of FIG. 10 includes two transistor contact pads 721a and 721b, two group III nitride device contact pads 521a and 521b, and a gate contact pad 541.

Figure 12:
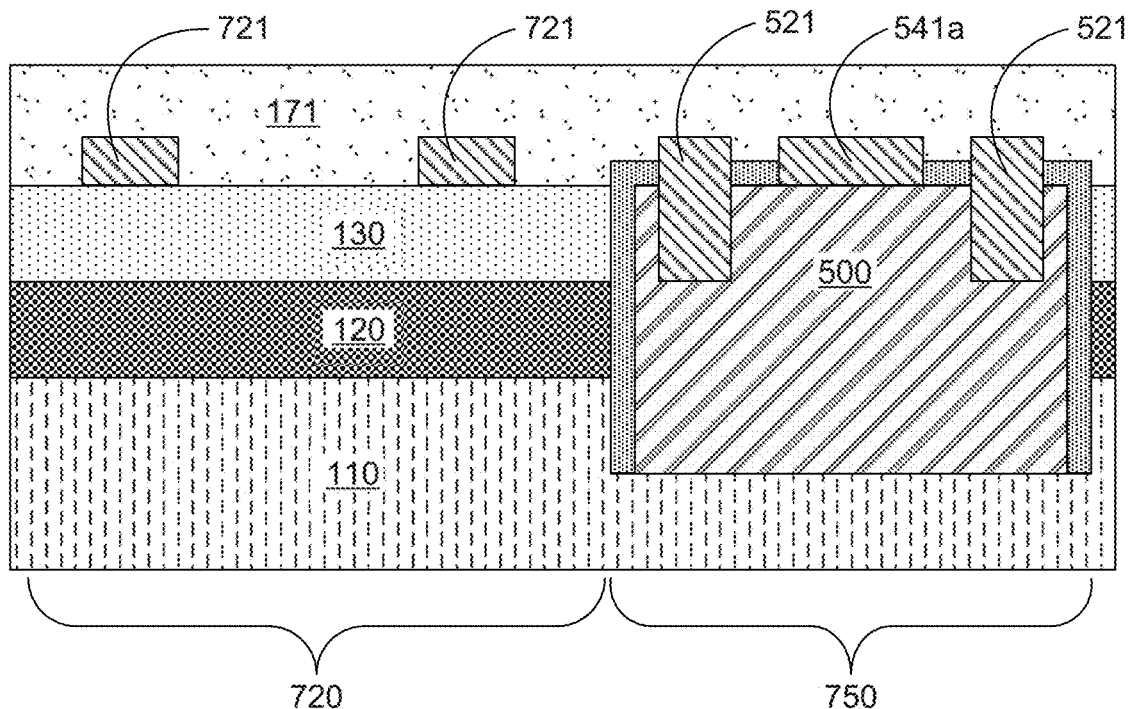
FIG. 12 is a cross-sectional view of the exemplary semiconductor structure of FIG. 11 after formation of a layer of dielectric material that covers the remaining portions of conductive material, in accordance with an embodiment of the present invention.

FIG. 12 is a cross-sectional view of the exemplary semiconductor structure of FIG. 11 after formation of a layer of dielectric material, denoted dielectric 171, that covers transistor contact pads 721a and 721b, group III nitride device contact pads 521a and 521b, and gate contact pad 541 in accordance with an embodiment of the present invention.

Figure 13:
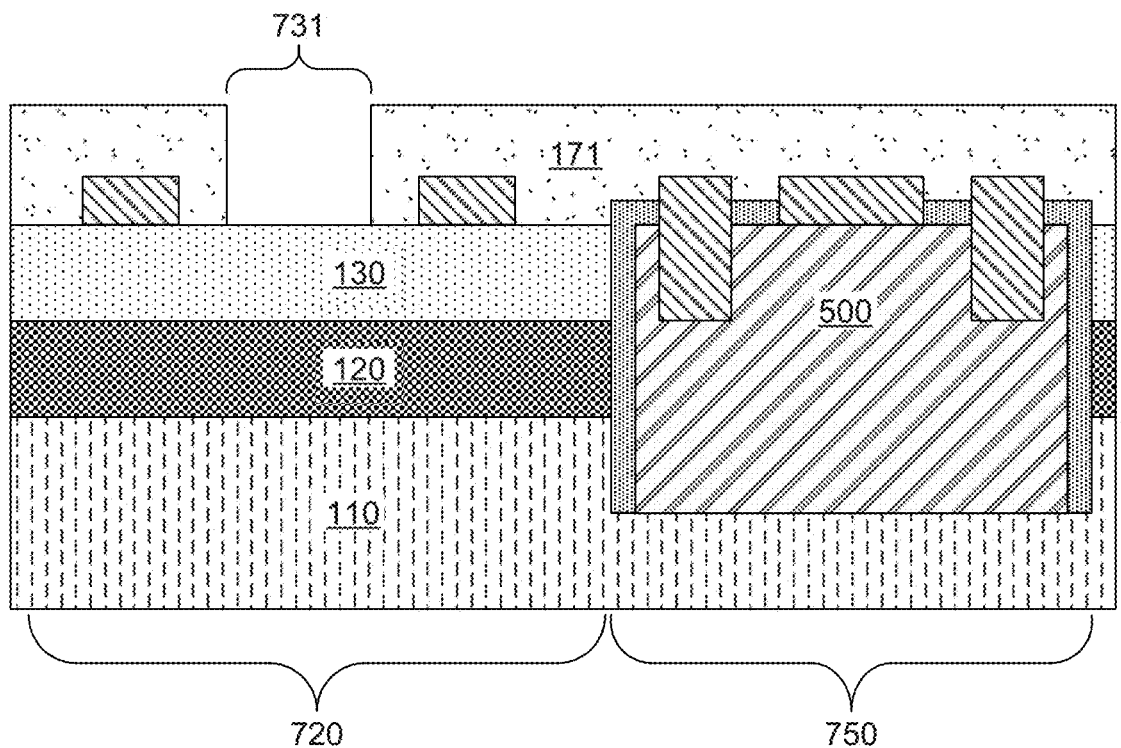
FIG. 13 is a cross-sectional view of the exemplary semiconductor structure of FIG. 12 after formation of a trench in the layer of dielectric material, in accordance with an embodiment of the present invention.

FIG. 13 is a cross-sectional view of the exemplary semiconductor structure of FIG. 12 after formation of a trench 731, in the layer of dielectric material in accordance with an embodiment of the present invention.

Figure 14:
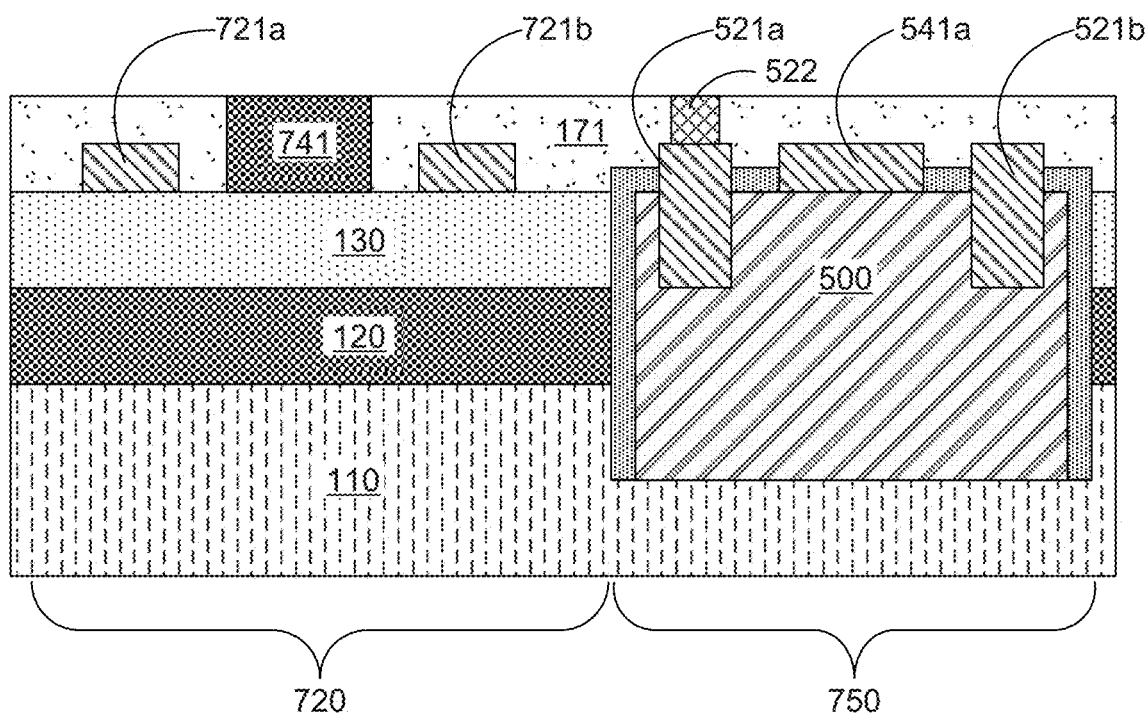
FIG. 14 is a cross-sectional view of the exemplary semiconductor structure of FIG. 13 after formation of an oxide material in the trench and a wire that is in contact with one of the portions of conductive material, in accordance with an embodiment of the present invention.

FIG. 14 is a cross-sectional view of the exemplary semiconductor structure of FIG. 13 after formation of (i) oxide material, herein denoted gate oxide 741, in trench 731 and (ii) a wire, 522, that is in contact with group III nitride device contact pads 521*a* that penetrate the Group III nitride layer within the trench in accordance with an embodiment of the present invention. One having ordinary skill in the art understands that wire 522 can be formed by etching a trench until the surface of group III nitride device contact pads 521*a* is exposed and the trench is filled with a conductive material, wherein overflow material may then be removed by CMP. In general, wire 522 supplies a source current for the group III nitride transistor device, included in group III nitride device region 750, which can then then flow out the drain (i.e., out of the other group III nitride device contact pad 521).

Figure 15:
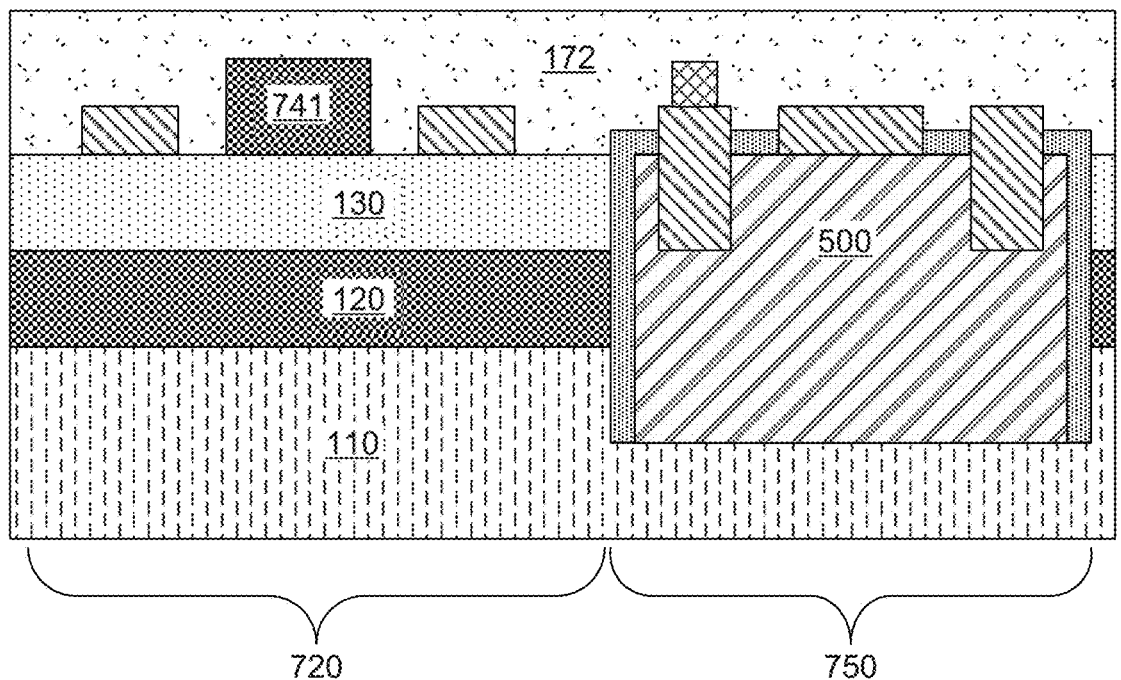
FIG. 15 is a cross-sectional view of the exemplary semiconductor structure of FIG. 14 after formation of a contiguous layer of dielectric material that covers the oxide material and the wire, in accordance with an embodiment of the present invention.

FIG. 15 is a cross-sectional view of the exemplary semiconductor structure of FIG. 14 after formation of a layer of dielectric material, 172, that covers the top surfaces of gate oxide 741 and wire 522 in accordance with an embodiment of the present invention.

Figure 16:
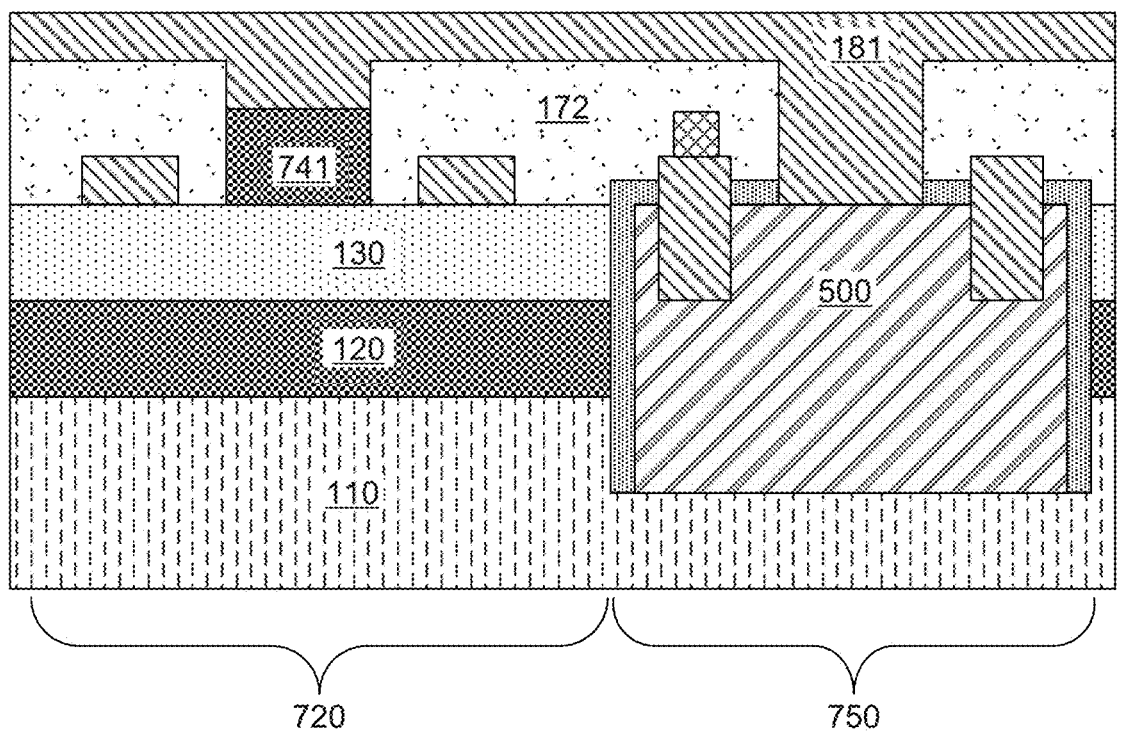
FIG. 16 is a cross-sectional view of the exemplary semiconductor structure of FIG. 15 after formation of a layer of conductive material, in accordance with an embodiment of the present invention.

FIG. 16 is a cross-sectional view of the exemplary semiconductor structure of FIG. 15 after (I) formation of two trenches (not shown) in the layer of dielectric material 172 that exposes (i) the top-most surface of gate oxide 741 and (ii) a top-most surface of gate contact pad 541, and (II) a subsequent filling of the two trenches with a conductive material 181 in accordance with an embodiment of the present invention.

Figure 17:
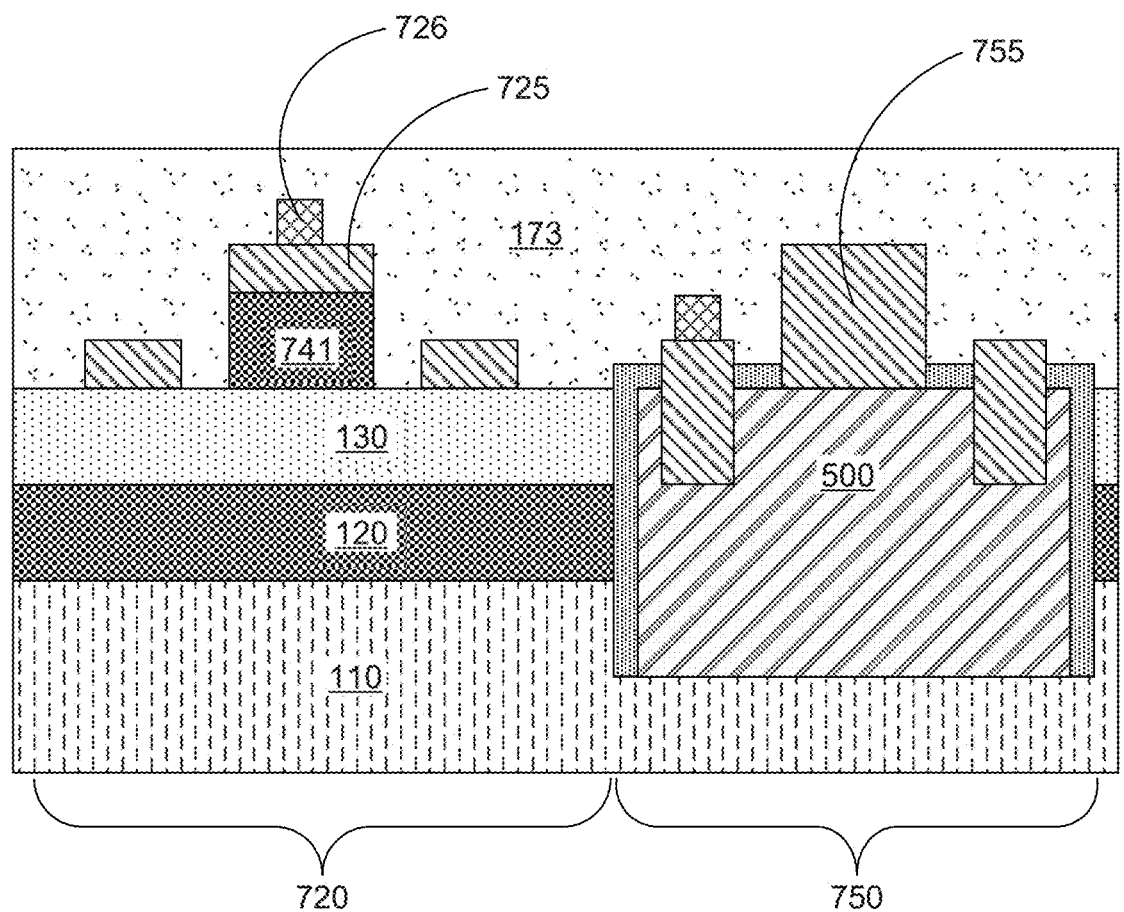
FIG. 17 is a cross-sectional view of the exemplary semiconductor structure of FIG. 16 after the formation of two gate pads, in accordance with an embodiment of the present invention.

FIG. 17 is a cross-sectional view of the exemplary semiconductor structure of FIG. 16 after the formation of two gate pads, 725 and 755. The process that yields the structures depicted in FIG. 17 may include (I) a CMP process that removes portions of conductive material 181 to form gate pads 725 and 755, (II) deposition a layer of dielectric material that covers the surfaces gate pads 725 and 755, (III) formation of a wire, 726, that is in contact with gate pad 725, which abuts the surface of gate oxide 741, and (IV) another deposition of a layer of dielectric material, yielding dielectric material 173, that covers the exposed surfaces gate pads 725 and 755, and wire 726. One having ordinary skill in the art understands that wire 526 can be formed by etching a trench in dielectric material until the surface of gate pad 725 is exposed and the trench is filled with a conductive material, wherein overflow material may then be removed by CMP. One having ordinary skill in the art readily understands that various processes, including etching, masking, and deposition processes and combinations thereof, may be employed to form the structures depicted in FIG. 17, as such, for brevity, extremely detailed description of such processes are herein omitted. Further, while certain processes are not explicitly recited, one having ordinary skill in the art readily understands that such processes are implied either directly or indirectly by the depiction of these structures and their description herein.

One having ordinary skill in the art readily recognizes that the processes for forming various structures described hereinafter are exemplary and does not limit embodiments to only the processes described herein.

It is to be noted that gate pad 725, gate oxide 741, transistor contact pads 721*a* and 721*b*, and doped regions 710 comprise a transistor device (e.g., a FET) that is included in device region 720 and whose activation/deactivation is controlled by signals received from wire 726. Further, group III nitride 500, group III nitride device contact pads 521, gate pad 755 comprise a group III nitride transistor device, such as an MMIC, included in group III nitride device region 750.

Figure 18:
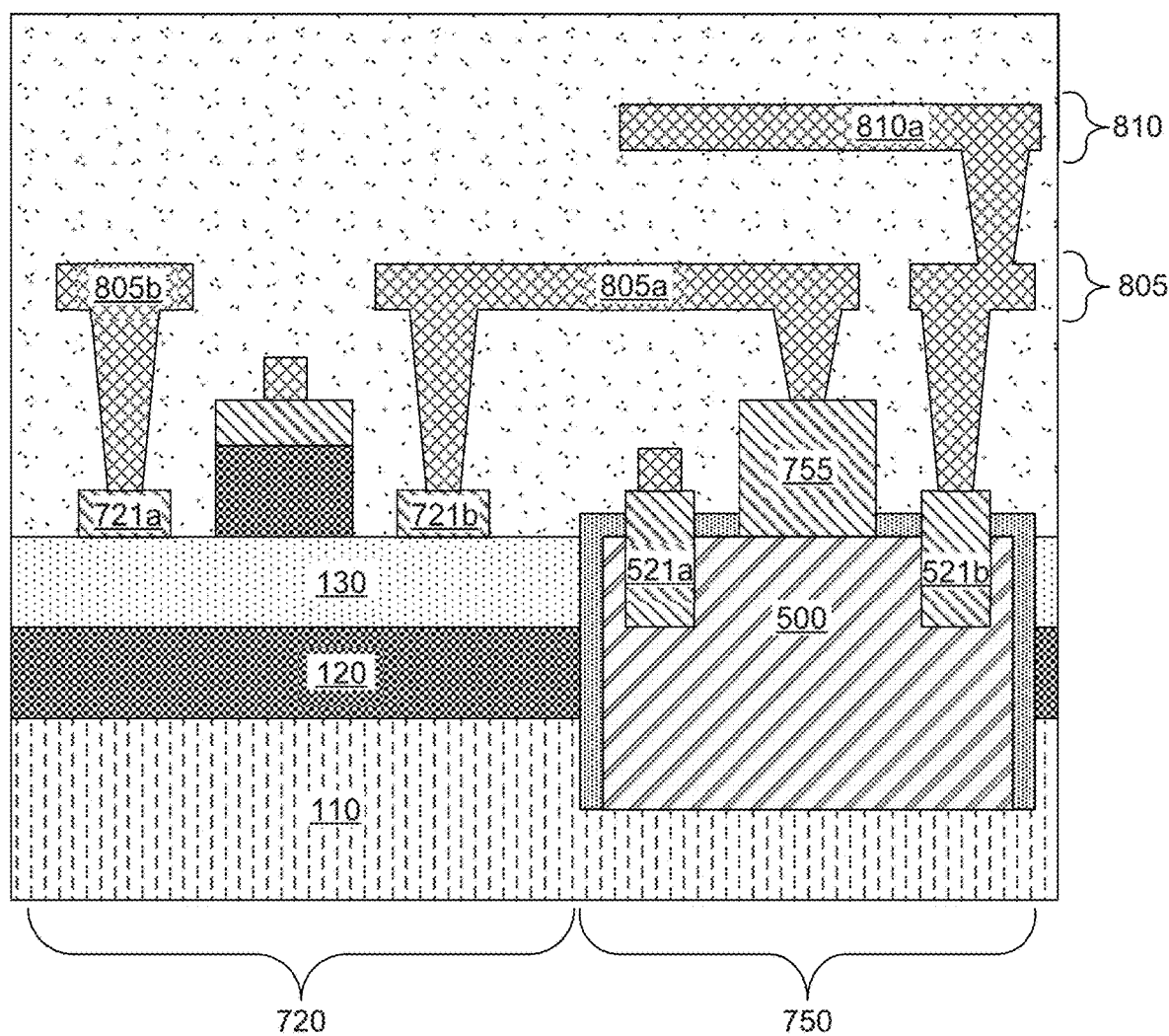
FIG. 18 is a cross-sectional view of the exemplary semiconductor structure of FIG. 17 after the formation of through-vias that connect the to a first level of interconnect wires and a second level of interconnect wires, in accordance with an embodiment of the present invention.

FIG. 18 is a cross-sectional view of the exemplary semiconductor structure of FIG. 17 after the formation of through-vias that connect the to a first level of interconnect wires, 805, and a second level of interconnect wires, 810 in accordance with an embodiment of the present invention. In general, FIG. 18 depicts a fully-integrated group III nitride device. As depicted, transistor contact pads 721*a* and 721*b* are connected to the first level of interconnect wires 805. Further, a wire, 805*a*, included in the first level of interconnect wires 805, forms an electrical connection between transistor contact pad 721*b* and gate pad 755. In general, wire 805*a* is less than 3 mm in length. Transistor contact pad 721*a* is connected to a different wire, 805*b*, that is also included in the first level of interconnect wires 805. Therefore, one having ordinary skill in the art understands that an activation of the transistor device included in transistor device region 720 controls the activation of the group III nitride transistor device, such as an MMIC, included in group III nitride device region 750. As such, a current flowing through the transistor device (i.e., from wire 805*b*, through the transistor, and to wire 805*a*) that is included in transistor device region 720 sends current to/controls the activation/deactivation of the group III nitride transistor device, such as an MMIC, included in group III nitride device region 750. Therefore, one having ordinary skill in the art understands that the flow of current from wire 522, through the group III nitride transistor device (i.e., from group III nitride device contact pad 521*a*, through group III nitride 500, and out group III nitride device contact pad 521*b*) and out via wire 810*a* included in the second level of interconnect wires 810 is controlled by a gate current that is supplied via wire 805*a*.

Embodiments of the present invention provide a reduction in parasitic inductance by reducing wire length. For a discreet GaN device, a length of the connection, i.e., the length of bond wire, is ~700 μm, and the resulting parasitic inductance for the bond wire is 0.45 nH. In contrast, for a fully-integrated GaN device, such as those described herein with reference to FIGS. 1-18, the lateral distance, i.e., the length of the connection can be greatly reduced, e.g., to less than 500 nm. Such a reduction in the length of the connection yields a 1400 times reduction in parasitic induction for fully-integrated GaN device when compared to discrete GaN.

In addition, distance between wire and the ground plane are also different for fully-integrated GaN device when compared to discrete GaN. More specifically, discrete GaN typically have a relatively large distance between the wire and ground plane under it, yielding a wire bond parasitic inductance of 200~300 μm. In contrast, for fully-integrated GaN-on-Si, the metal connection is implemented by the BEOL metal. As such, the distance is much shorter by comparison, i.e., 2 μm, yielding a 2.6 times reduction in parasitic induction for fully-integrated GaN device when compared to discrete GaN. As such, the resulting parasitic induction for fully-integrated GaN device is 0.12 pH while the parasitic induction for discrete GaN is 0.45 nH, which indicates a 3640 times reduction in parasitic induction overall for fully-integrated GaN devices when compared to discrete GaN devices.

Figure 19:
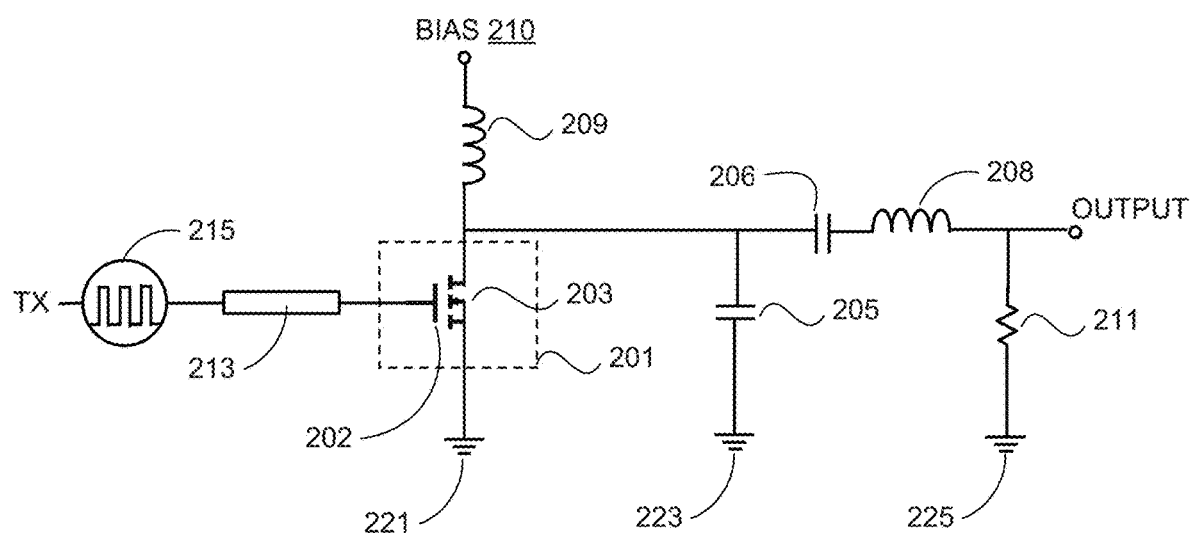
FIG. 19 is a circuit diagram for a class-E power amplifier, in accordance with an embodiment of the present invention.

FIG. 19 is a circuit diagram for a class-E power amplifier in accordance with an embodiment of the present invention. As depicted the circuit includes a silicon pre-driver 215, a transmission line 213, and a GaN area 201 that further includes gate 202 of GaN HEMT 203, which is a fully-integrated group III nitride device following the embodiments disclosed herein with reference to FIGS. 1-18. The circuit further includes induction coil 209 (controlled by BIAS 210), induction coil 208, resistor 211, capacitors 205 and 206, and ground connections 221, 223, and 225.

In one embodiment, a semiconductor structure is provided that comprises: a semiconductor-on-insulator (SOI) substrate; a silicon-based transistor that includes a portion of a silicon layer of the SOI substrate; and a group III nitride transistor device that is embedded in the SOI substrate and is adjacent to the silicon-based transistor. In one embodiment, a semiconductor structure is provided that comprises: a first electrical contact that connects a first source/drain structure of the silicon-based transistor to a gate of the group III nitride transistor device. In one embodiment, a semiconductor structure is provided in which the first electrical contact is less than 3 mm in length. In one embodiment, a semiconductor structure is provided in which the group III nitride transistor device is a Monolithic Microwave Integrated Circuit (MIMIC). In one embodiment, a semiconductor structure is provided in which the semiconductor-on-insulator (SOI) substrate includes, from bottom to top, a (111) silicon layer, a buried insulator layer, and a (100) silicon layer. In one embodiment, a semiconductor structure is provided in which group III nitride transistor device includes at least one Group III nitride material layer embedded within a trench that extends through the (100) silicon layer and the buried insulator layer and into an upper portion of the (111) silicon layer. In one embodiment, a semiconductor structure is provided in which at least one Group III nitride material, of the group III nitride transistor device, abuts a sub-surface of a (111) silicon layer of the SOI substrate. In one embodiment, a semiconductor structure is provided in which at least one Group III nitride material, of the group III nitride transistor device, has a topmost surface that is above, coplanar with, or below a top surface of a (100) silicon layer of the SOI substrate. In one embodiment, a semiconductor structure is provided in which the group III nitride transistor device comprises (i) a Group III nitride buffer layer and (ii) a Group III nitride channel layer located on the Group III nitride buffer layer, wherein the Group III nitride channel layer has a top surface that is above, coplanar with, or below a top surface of a (100) silicon layer of the SOI substrate. In one embodiment, a semiconductor structure is provided in which the group III nitride transistor device comprises (i) a buffer layer comprising GaN and (ii) a channel layer comprising AlGaN. In one embodiment, a semiconductor structure is provided in which the group III nitride transistor device is included in a trench in the SOI substrate, and wherein the trench includes a spacer structure located between sidewalls of the trench and sidewalls of the at least one Group III nitride layer of the group III nitride transistor device. In one embodiment, a semiconductor structure is provided in which the spacer structure is in direct contact with entire sidewalls of the at least one Group III nitride material layer. In one embodiment, a semiconductor structure is provided in which the spacer structure comprises a first sidewall spacer adjoined to the sidewalls of the trench and a second sidewall spacer adjoined to the sidewalls of the at least one Group III nitride layer. In one embodiment, a semiconductor structure is provided in which the first sidewall spacer comprises silicon nitride, and wherein the second sidewall spacer comprises silicon dioxide, aluminum oxide or hafnium oxide. In one embodiment, a semiconductor structure is provided that comprises: a second electrical contact that connects a first source/drain structure of the group III nitride transistor device to an induction coil; a transmission line connected the gate of the group III nitride transistor device; and a third electrical contact that connects a ground connection to a second source/drain structure of the group III nitride transistor device.

In one embodiment, a method is provided that comprises: forming a semiconductor-on-insulator (SOI) substrate; forming a silicon-based transistor that includes a portion of a silicon layer of the SOI substrate; and forming a group III nitride transistor device that is embedded in the SOI substrate and is adjacent to the silicon-based transistor. In one embodiment, a method is provided that comprises: forming a first electrical contact that connects a source/drain structure of the silicon-based transistor to a gate of the group III nitride transistor device. In one embodiment, a method is provided in which the first electrical contact is less than 3 mm in length. In one embodiment, a method is provided in which the group III nitride transistor device is a Monolithic Microwave Integrated Circuit (MMIC). In one embodiment, a method is provided in which the semiconductor-on-insulator (SOI) substrate includes, from bottom to top, a (111) silicon layer, a buried insulator layer, and a (100) silicon layer. In one embodiment, a method is provided in which group III nitride transistor device includes at least one Group III nitride material layer embedded within a trench that extends through the (100) silicon layer and the buried insulator layer and into an upper portion of the (111) silicon layer. In one embodiment, a method is provided in which at least one Group III nitride material, of the group III nitride transistor device, abuts a sub-surface of a (111) silicon layer of the SOI substrate. In one embodiment, a method is provided in which at least one Group III nitride material, of the group III nitride transistor device, has a topmost surface that is above, coplanar with, or below a top surface of a (100) silicon layer of the SOI substrate. In one embodiment, a method is provided in which the group III nitride transistor device comprises (i) a Group III nitride buffer layer and (ii) a Group III nitride channel layer located on the Group III nitride buffer layer, wherein the Group III nitride channel layer has a top surface that is above, coplanar with, or below a top surface of a (100) silicon layer of the SOI substrate. In one embodiment, a method is provided in which the group III nitride transistor device comprises (i) a buffer layer comprising GaN and (ii) a channel layer comprising AlGaN. In one embodiment, a method is provided in which the group III nitride transistor device is included in a trench in the SOI substrate, and wherein the trench includes a spacer structure located between sidewalls of the trench and sidewalls of the at least one Group III nitride layer of the group III nitride transistor device. In one embodiment, a method is provided in which the spacer structure is in direct contact with entire sidewalls of the at least one Group III nitride material layer. In one embodiment, a method is provided in which the spacer structure comprises a first sidewall spacer adjoined to the sidewalls of the trench and a second sidewall spacer adjoined to the sidewalls of the at least one Group III nitride layer. In one embodiment, a method is provided in which the first sidewall spacer comprises silicon nitride, and wherein the second sidewall spacer comprises silicon dioxide, aluminum oxide or hafnium oxide. In one embodiment, a method is provided that comprises: a second electrical contact that connects a first source/drain structure of the group III nitride transistor device to an induction coil; a transmission line connected the gate of the group III nitride transistor device; and a third electrical contact that connects a ground connection to a second source/drain structure of the group III nitride transistor device.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as, for instance, "side", "over", "perpendicular", "tilted", etc., as used herein refer to relative location and orientation of various portions of the structures with respect to one another, and are not intended to suggest that any particular absolute orientation with respect to external objects is necessary or required.

The foregoing specification also describes processing steps. While some of the steps may be in an ordered sequence, others may in different embodiments from the order that they were detailed in the foregoing specification. The ordering of steps when it occurs is explicitly expressed, for instance, by such adjectives as, "ordered", "before", "after", "following", and others with similar meaning.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art.

What is claimed is:

1. A semiconductor structure comprising:
   a semiconductor-on-insulator (SOI) substrate;
   a silicon-based transistor that includes a portion of a silicon layer of the SOI substrate;
   a group III nitride transistor device that is embedded in the SOI substrate and is adjacent to the silicon-based transistor;
   a first electrical contact of a first level of interconnect wires that connects a first source/drain structure of the silicon-based transistor to a gate structure of the group III nitride transistor device; and
   a second electrical contact of a second level of interconnect wires that connects a second device pad to the second level of interconnect wires;
   wherein:
   current flow through the group III nitride transistor device from a first device pad to the second device pad is controlled by gate current supplied from the first electrical contact connected to the first source/drain structure of the silicon-based transistor;
   the semiconductor-on-insulator (SOI) substrate includes, from bottom to top, a (111) silicon layer, a buried insulator layer, and a (100) silicon layer;
   the group III nitride transistor device includes at least one Group III nitride material layer embedded within a trench that extends through the (100) silicon layer and the buried insulator layer and into an upper portion of the (111) silicon layer, making contact directly with the (111) silicon layer; and the group III nitride transistor device is included in a trench in the SOI substrate.

2. The semiconductor structure of claim 1, wherein the group III nitride transistor device is a Monolithic Microwave Integrated Circuit (MMIC).

3. The semiconductor structure of claim 1, wherein at least one Group III nitride material, of the group III nitride transistor device, abuts a sub-surface of a (111) silicon layer of the SOI substrate.

4. The semiconductor structure of claim 1, wherein at least one Group III nitride material, of the group III nitride transistor device, has a topmost surface that is above, coplanar with, or below a top surface of a (100) silicon layer of the SOI substrate.

5. The semiconductor structure of claim 1, wherein the group III nitride transistor device comprises (i) a Group III nitride buffer layer and (ii) a Group III nitride channel layer located on the Group III nitride buffer layer, wherein the Group III nitride channel layer has a top surface that is above a top surface of a (100) silicon layer of the SOI substrate.

6. The semiconductor structure of claim 1, wherein the group III nitride transistor device comprises (i) a buffer layer comprising GaN and (ii) a channel layer comprising AlGaN.

7. The semiconductor structure of claim 1, wherein the spacer structure is in direct contact with entire sidewalls of the at least one Group III nitride material layer.

8. The semiconductor structure of claim 1, wherein:
   the second electrical contact connects the second device pad of the group III nitride transistor device to an induction coil.

9. The semiconductor structure of claim 1, wherein:
   the trench includes a spacer structure located between sidewalls of the trench and sidewalls of the at least one Group III nitride layer of the group III nitride transistor device; and
   the spacer structure comprises a first sidewall spacer adjoined to the sidewalls of the trench and a second sidewall spacer adjoined to the sidewalls of the at least one Group III nitride layer.

10. The semiconductor structure of claim 9, wherein the first sidewall spacer comprises silicon nitride, and wherein the second sidewall spacer comprises silicon dioxide, aluminum oxide or hafnium oxide.

11. A method of forming a semiconductor structure comprising:
    forming a semiconductor-on-insulator (SOI) substrate;
    forming a silicon-based transistor that includes a portion of a silicon layer of the SOI substrate;
    forming a group III nitride transistor device that is embedded in the SOI substrate and is adjacent to the silicon-based transistor;
    a first electrical contact of a first level of interconnect wires that connects a first source/drain structure of the silicon-based transistor to a gate structure of the group III nitride transistor device; and
    a second electrical contact of a second level of interconnect wires that connects a second device pad to the second level of interconnect wires;
    wherein:
    current flow through the group III nitride transistor device from a first device pad to the second device pad is controlled by gate current supplied from the first electrical contact connected to the first source/drain structure of the silicon-based transistor;
    the semiconductor-on-insulator (SOI) substrate includes, from bottom to top, a (111) silicon layer, a buried insulator layer, and a (100) silicon layer;

the group III nitride transistor device includes at least one Group III nitride material layer embedded within a trench that extends through the (100) silicon layer and the buried insulator layer and into an upper portion of the (111) silicon layer, making contact directly with the (111) silicon layer; and the group III nitride transistor device is included in a trench in the SOI substrate.

12. The method of claim 11, wherein the group III nitride transistor device is a Monolithic Microwave Integrated Circuit (MMIC).

13. The method of claim 11, wherein:

the trench includes a spacer structure located between sidewalls of the trench and sidewalls of the at least one Group III nitride layer of the group III nitride transistor device; and the spacer structure comprises a first sidewall spacer adjoined to the sidewalls of the trench and a second sidewall spacer adjoined to the sidewalls of the at least one Group III nitride layer.

14. The method of claim 11, wherein the group III nitride transistor device comprises (i) a Group III nitride buffer layer and (ii) a Group III nitride channel layer located on the Group III nitride buffer layer, wherein the Group III nitride channel layer has a top surface that is above a top surface of a (100) silicon layer of the SOI substrate.

\* \* \* \* \*